(12) United States Patent
Dobisz et al.

(10) Patent No.: US 10,720,573 B2
(45) Date of Patent: Jul. 21, 2020

(54) METHOD FOR MANUFACTURING MAGNETIC TUNNEL JUNCTION PILLARS USING PHOTOLITHOGRAPHICALLY DIRECTED BLOCK COPOLYMER SELF-ASSEMBLY AND ORGANOMETALLIC GAS INFUSION

(71) Applicant: Spin Transfer Technologies, Inc., Fremont, CA (US)

(72) Inventors: Elizabeth A. Dobisz, San Jose, CA (US); Prachi Shrivastava, Newark, CA (US)

(73) Assignee: SPIN MEMORY, INC., Fremont, CA (US)

( * ) Notice: Subject to any disclaimer, the term of this patent is extended or adjusted under 35 U.S.C. 154(b) by 106 days.

(21) Appl. No.: 15/859,467

(22) Filed: Dec. 30, 2017

(65) Prior Publication Data
US 2019/0207108 A1    Jul. 4, 2019

(51) Int. Cl.
*H01L 43/12* (2006.01)
*H01L 43/08* (2006.01)
*H01L 27/22* (2006.01)

(52) U.S. Cl.
CPC ............ *H01L 43/12* (2013.01); *H01L 27/222* (2013.01); *H01L 43/08* (2013.01)

(58) Field of Classification Search
CPC combination set(s) only.
See application file for complete search history.

(56) References Cited

U.S. PATENT DOCUMENTS 9,576,817 B1 *   2/2017   Cheng ................. H01L 21/0271

OTHER PUBLICATIONS

Princeton University, "Chemical and Biological Engineering," The Trustees of Princeton University, 2019, 1 page, retrieved from https://cbe.princeton.edu/people/faculty/register/group/research/Bulk.
Gronheid et al., "Implementation of Templated DSA for Via Layer Patterning at the 7nm node," Proceedings of SPIE: The International Society for Optical Engineering, Mar. 2015, 11 pages.
Ruiz et al., "Image quality and pattern transfer in dierected self assembly with block-selective atomic layer deposition," Journal of Vacuum Science & Technology B, vol. 30, No. 6, Nov./Dec. 2012, pp. 06F202-1-06F202-6.

(Continued)

*Primary Examiner* — Tony Tran
(74) *Attorney, Agent, or Firm* — Zilka-Kotab, P.C.

(57) ABSTRACT

A method for manufacturing a magnetic random access memory array at a density greater than would be possible using photolithography. A template is formed having a pattern that is configured to define a memory array. A block copolymer material is deposited onto the template and annealed to form narrow cylinders of ordered block copolymer material. A metal oxide is then diffused into the cylinders to form narrow metal oxide cylinders. The metal oxide cylinders can then be used as mask structures to pattern a hard mask layer. An ion milling process can then be performed to transfer the image of the patterned hard mask onto an underlying magnetic memory material to form an array having features sizes smaller than what would be possible using photolithography.

15 Claims, 20 Drawing Sheets

(56) References Cited

OTHER PUBLICATIONS

Zhang et al., "Surface Morphology Diagram for Cylinder-Forming Block Copolymer Thin Films," ACS Nano, vol. 2, No. 11, Nov. 25, 2008, pp. 2331-2341.
Yi et al., "A General Design Strategy for Block Copolymer Directed Self-Assembly Patterning of Integrated Circuits Contact Holes using an Alphabet Approach," ACS Publications, Nano Letters, Issue 15, Dec. 31, 2014, pp. 305-812.
Yi et al., "Directed self-assembly guiding template design for contact hole patterning," Elsevier Ltd., 2015, pp. 257-280.
Ruiz et al., "Density Multiplication and Improved Lithography by Directed Block Copolymer Assembly," Science, vol. 321, Aug. 15, 2008, pp. 936-939.
Doise et al., "Implementation of surface energy modification in graphoepitaxy directed self-assembly for hole multiplication," Journal of Vacuum Science & Technology B, Issue 33, 2015, pp. 06F301-1-06F301-9.

\* cited by examiner

METHOD FOR MANUFACTURING MAGNETIC TUNNEL JUNCTION PILLARS USING PHOTOLITHOGRAPHICALLY DIRECTED BLOCK COPOLYMER SELF-ASSEMBLY AND ORGANOMETALLIC GAS INFUSION

FIELD OF THE INVENTION

The present invention relates to magnetic random access memory (MRAM) and more particularly to a method for manufacturing magnetic tunnel junction pillar structures at high density using photolithographically defined directed block copolymer self-assembly and organometallic gas infusion.

BACKGROUND

Magnetic Random Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When, the orientations of the magnetizations of the free and reference layer are oriented in the same direction, the spin of the electrons in the free layer are in generally the same direction as the orientation of the spin of the electrons in the reference layer. Because these electron spins are in generally the same direction, the electrons can pass relatively easily through the tunnel barrier layer. However, if the orientations of the magnetizations of the free and reference layers are opposite to one another, the spin of electrons in the free layer will be generally opposite to the spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as an on or "1", whereas the high resistance state can be read as a "0". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded date bit is non-volatile in that it remains intact in the absence of any electrical power.

SUMMARY

The present invention provides a method for manufacturing a magnetic random access memory array having a very high density, with very small features sizes. The method includes providing a substrate and depositing a magnetic memory material over the substrate. A template is formed over the magnetic memory element material, the template having an opening. A block chain copolymer is deposited over the template such that a portion of the block chain copolymer is deposited into the opening in the template. An annealing process is then performed to cause the block copolymer to form pillars within the openings in the template. A metal is then diffused into the pillars to form metal oxide pillars. The metal oxide pillars are then used as a mask to form magnetic memory pillars in the underlying magnetic memory element material.

The above described process forms memory element pillars at a density that is much higher than that which would be possible using photolithography alone. The pattern in the template can be either in the form of individual openings such as circles or can be formed as trenched. The trenches can be formed with a dimension that is a multiple of a natural period of the block copolymer material to form an ordered array of pillars within the trench. The pillars can be in multiple rows that can be arranged in a hexagonal close packed configuration.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
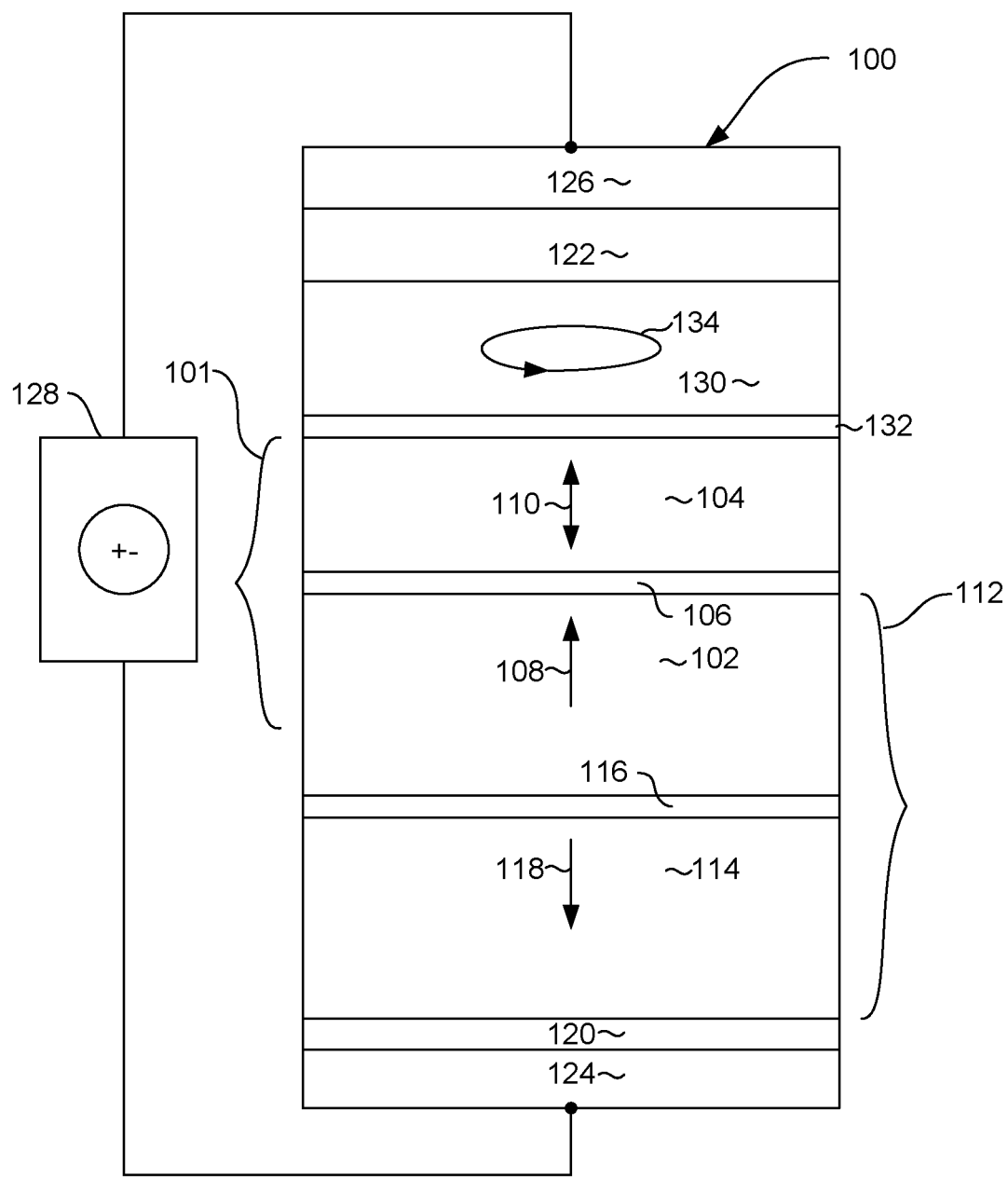
FIG. 1 is a schematic, cross sectional view of a perpendicular magnetic tunnel junction (pMTJ) element, such as might be used in an embodiment of the invention.

Referring now to FIG. 1, a magnetic memory element 100 can be in the form a of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating magnetic barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer has a magnetization 110 that can be in either of two directions perpendicular to the plane of the layer 104. While the magnetization 110 of the free layer remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure 112 that can include a magnetic keeper layer 114, and a non-magnetic, antiparallel coupling layer 116 located between the keeper layer 114 and reference layer 102. The antiparallel coupling layer 116 can be a material such as Ru and can be constructed to have a thickness such that it will ferromagnetically antiparallel couple the layers 114, 102. The antiparallel coupling between the layers 114, 102 pins the magnetization 108 of the reference layer 102 in a direction opposite to the direction of magnetization 118 of the keeper layer 114.

A seed layer 120 may be provided near the bottom of the memory element 100 to initiate a desired crystalline structure in the above deposited layers. A capping layer 122 may be provided near the top of the memory element 100 to protect the underlying layers during manufacture, such as during high temperature annealing. Also, electrodes 124, 126 may be provided at the top and bottom of the memory element 100. The electrodes 124, 126 may be constructed of a non-magnetic, electrically conductive material such as Au and can provide electrical connection with circuitry 128 that can include a current source and can further include circuitry for reading an electrical resistance across the memory element 100.

The magnetic free layer 104 has a magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in an upward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in a downward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons will not be able to pass through the barrier layer 106. As a result, the electrons (which have been spin polarized by the magnetization 110 of the free layer 104, will accumulate at the junction between the free layer 104 and barrier layer 106. This accumulation of spin polarized electrons causes a spin torque that causes the magnetization 110 of the free layer 104 to flip from a downward direction to an upward direction.

In order to assist the switching of the magnetization 110 of the free layer 104, the memory element 100 may include a spin polarization layer 130 formed above the free layer 104. The spin polarization layer can be separated from the free layer 104 by an exchange coupling layer 132. The spin polarization layer 130 has a magnetic anisotropy that causes it to have a magnetization 134 with a primary component oriented in the in plane direction (e.g. perpendicular to the magnetizations 110, 108 of the free and reference layers 104, 102. The magnetization 134, of the spin polarization layer 130 may either be fixed or can move in a precessional manner as shown in FIG. 100. The magnetization 134 of the spin polarization layer 130 causes a spin torque on the free layer 104 that assists in moving its magnetization away from its quiescent state perpendicular to the plane of the free layer 104. This allows the magnetization 110 of the free layer 104 to more easily flip using less energy when applying a write current to the memory element 100.

Figure 2:
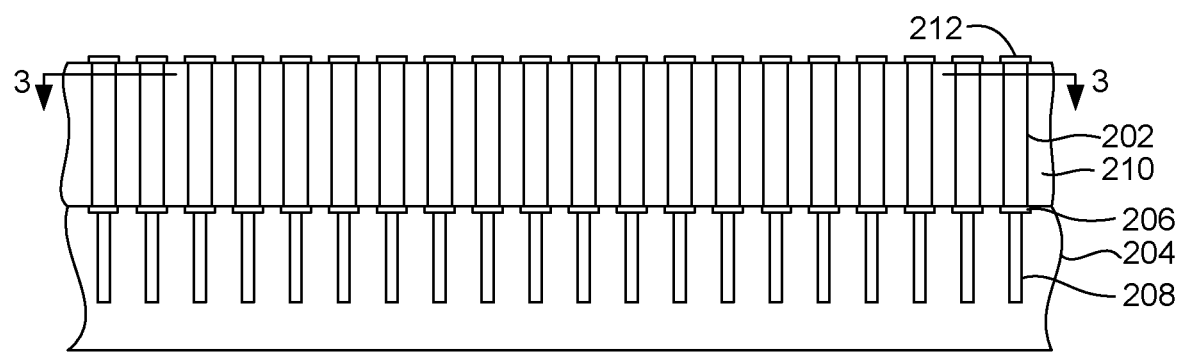
FIG. 2 is a side, cross sectional view of an array of magnetic random access memory elements formed on a substrate.

FIG. 2 shows a side, cross sectional view of an array 200 of magnetic random access memory elements 202 formed on a substrate 204. The substrate 204 can be a semiconductor material such as Si formed from a Si wafer. Each of the magnetic memory elements can be formed on an electrically conductive lead 206 that can connect the magnetic memory element 202 with underlying circuitry such as CMOS circuitry 208 embedded in the substrate 204. The memory elements 202 can be surrounded by an insulating material 210 such as $SiO_2$ or alumina $Al_2O_3$, and electrically conductive upper leads 212.

Figure 3:
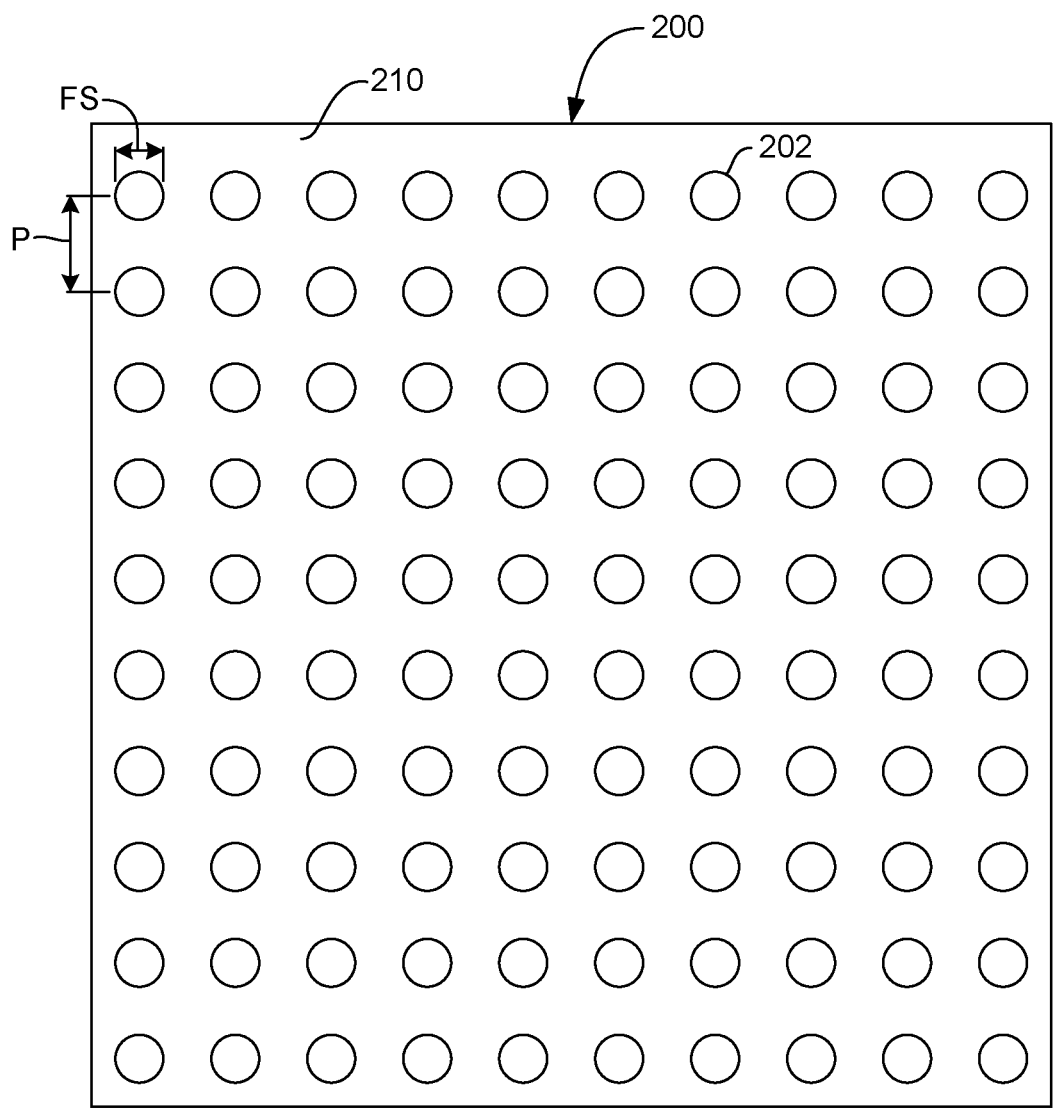
FIG. 3 is a top-down view of the array of magnetic random access memory elements as seen from line 3-3 of FIG. 2.

FIG. 3 shows a top-down, cross-sectional view as seen from line 3-3 of FIG. 2. From, both FIGS. 2 and 3, it can be seen that each of the magnetic memory elements 202 is formed as a cylindrically shaped pillar. In order to increase data density, it becomes necessary increase the number of memory elements 202 in a given area in the array 200. In FIG. 3, it can be seen that the distance between a given location on a memory element 202 to that same location on an adjacent magnetic memory element 202 defines a pitch (P) of the array. This size of each memory element 202 (in this case the diameter of the memory element cylinder) defines the feature size (FS).

With continued reference to FIG. 3, in order to increase data density of a magnetic random access array 200, it is necessary to decrease pitch P and feature size FS. However, processes such as photolithography, which are generally used to define features on a substrate such as a semiconductor wafer, have physical limitations. For example, photolithographic masking and exposure processes are limited by the wavelength of light that can be used to pattern images on the wafer. This has resulted in limits to the amount by which dimensions such as pitch P and features size FS can be reduced and has also correspondingly limited the amount by which data density can be increased.

The present invention overcomes this challenge, allowing features such as magnetic memory elements to be formed at a pitch P and features size FS that are far below the physical limitations of processes such as photolithography.

Figure 4:
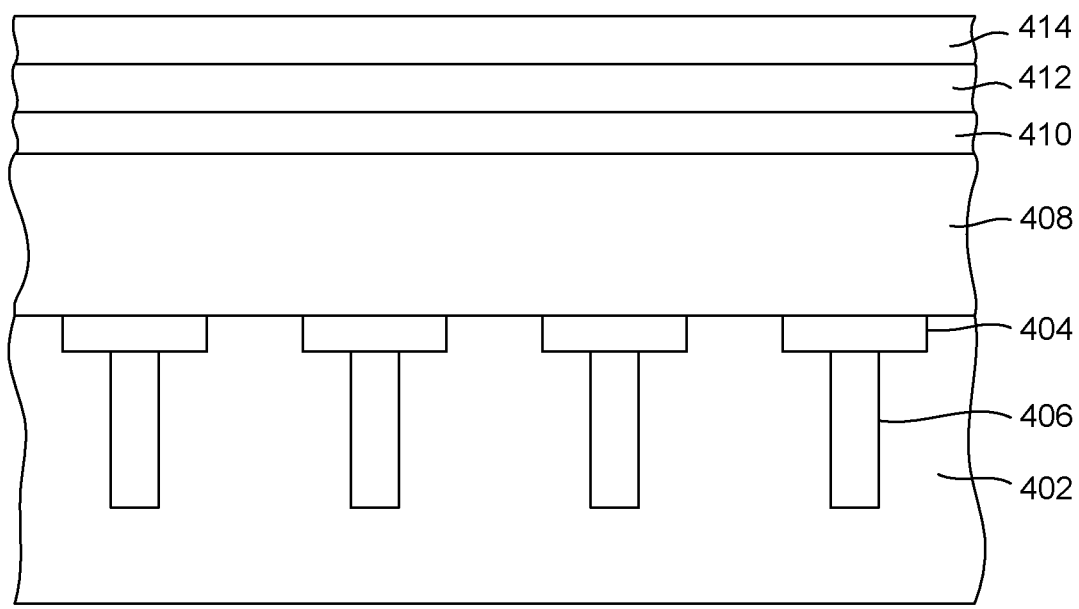
FIGS. 4-16, are views of a wafer in various intermediate stages of manufacture, illustrating a method for manufacturing an array of magnetic random access memory elements.

FIG. 4 shows a side, cross sectional view of a substrate 402 which can be a wafer such as a silicon wafer. The wafer can have electrically conductive lead layers 404 formed in its surface with, the lead layers 404 being arranged for connection with a magnetic memory pillar formed thereon. The electrically conductive lead layers 404 can be connected with underlying circuitry 406 such as CMOS circuitry.

With continued reference to FIG. 4, a layer of magnetic memory element material 408 is deposited over the substrate 402. Although shown in FIG. 4 as a single layer, it should be understood that this material layer 408 actually include various layers used to form a magnetic memory element such as the magnetic memory element 100 of FIG. 1. For example, the layer 408 would include a first and second magnetic layers and a non-magnetic barrier layer located between the first and second magnetic layers, as well as other layer necessary to form a magnetic memory element.

A hard mask material 410 is deposited over the magnetic memory material layer 408. The hard mask material can be a material such as TaN or diamond like carbon (DLC). Other mask layers 412 may be deposited over the hard mask layer 410. These other mask layers 412 can include one or more anti-reflective layers such as a bottom anti-reflective layer (BARC) as well as one or more image transfer layers. A layer of photoresist 414 is then deposited over the top of the layers 408, 410, 412. The photoresist layer 414 can be a spin-on glass type photoresist, such as a Si containing photoresist.

Figure 5:
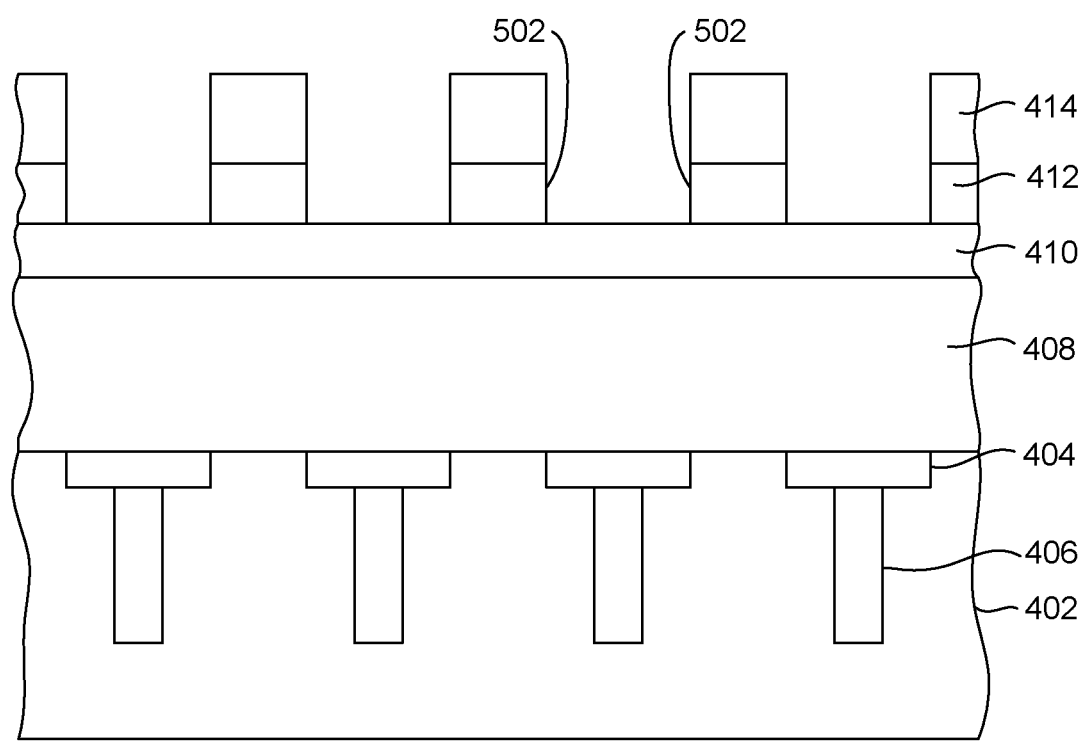
Figure 6:
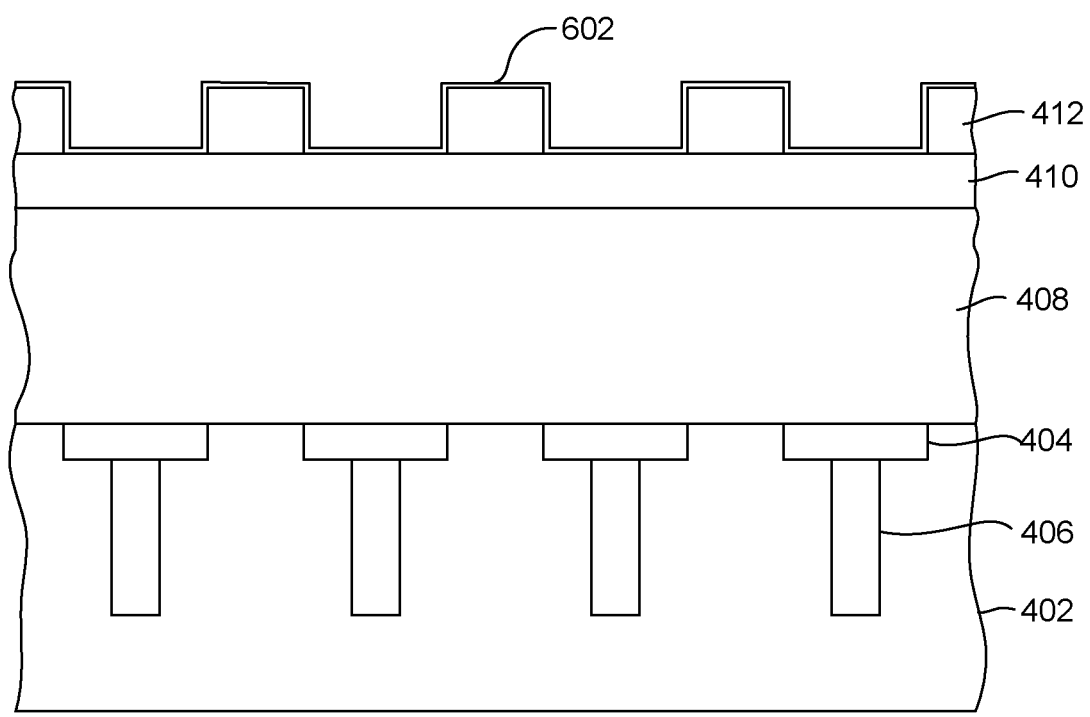

With reference now to FIG. 5, the photoresist is then photolithographically patterned and developed to form a photoresist mask 414 having opening 502 in areas over the electrically conductive lead structures 404 in areas where one or more magnetic recording elements will be formed. The openings 502 can have a circular shape, or could have a shape of a trench in which several magnetic memory elements will be formed. This will become clearer herein below with further discussion of methods according to different possible embodiments.

An etching process such as reactive ion etching (RIE) can be performed to transfer the image of the photoresist mask 414 onto one or more of the underlying mask layers (e.g. 412). Then, a chemical brush layer 602 is deposited. The chemical brush layer is a monomolecular material that binds to a surface. The brush layer 602 can be a random mixture of molecules that are similar to those of the block copolymer (yet to be deposited). The composition of the brush layer 602 can be chosen and the density can be varied by deposition conditions. The brush layer 602 can be chosen as a material exhibiting two properties; first to match with the surface that it selectively grafts (i.e. sidewalls vs. base of pattern onto which it is deposited); and second which block copolymer it weakly selectively binds with. In this manner, the cylinder to be formed will form in a desired location within the patterned, template surface. For example, a brush for polystyrene-b-PMMA block copolymer would be a mixture of styrene and methacrylate molecules with a hydroxylated end that attaches to a silicon, SiNx, or $SiO_2$ substrate.

Figure 7:
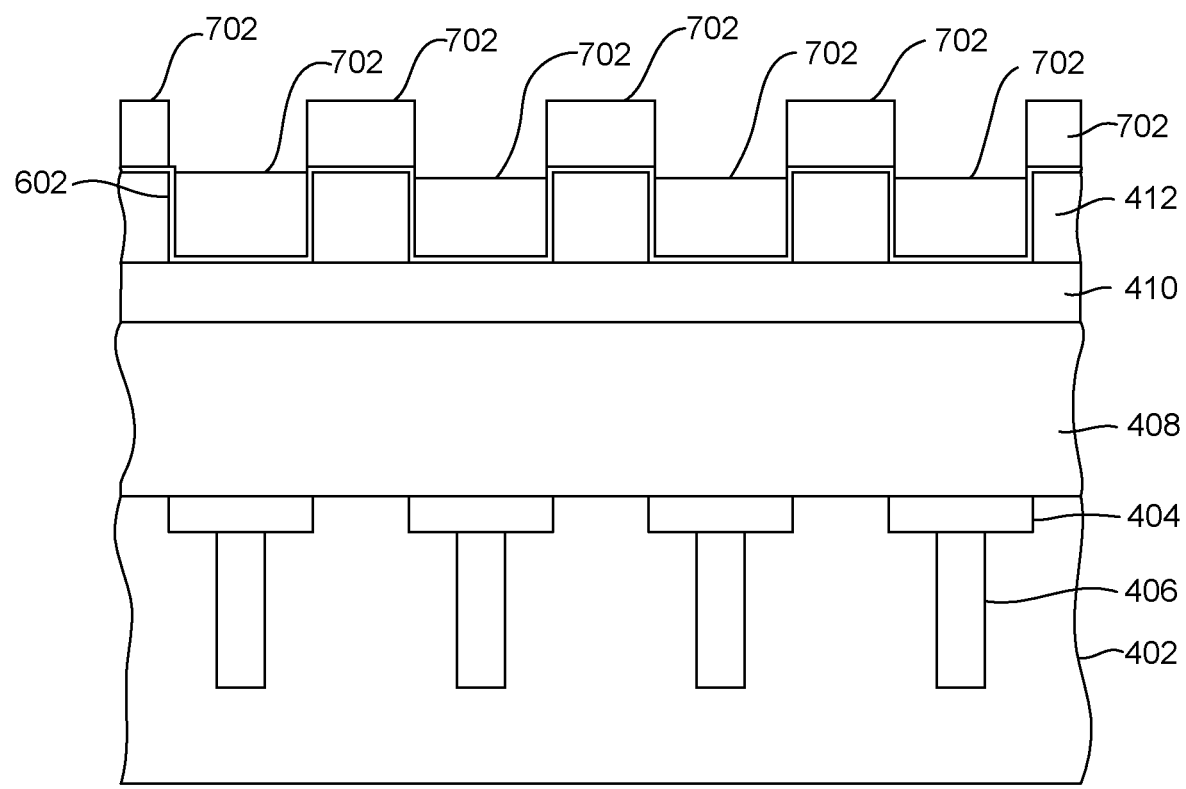

With reference now to FIG. 7, a layer of block copolymer material 702 is deposited. The block copolymer material can be a material such as polystyrene-b-polymethylmethacrylate, and can be deposited by spin coating so that the block copolymer material 702 covers areas within the openings in the mask 414, and as well as over the mask 414.

An annealing process is then performed, which causes the block copolymer within the openings to align to the template formed in the mask structure 412. Block copolymers are long continuous chain polymers composed of two or more repeating polymer units. The different polymer units in the chain are insoluble in each other and tend to repel. If annealed and allowed to reach thermodynamic equilibrium, the two or more block copolymers will phase separate. Because each block copolymer is attached at each end to an overall master chain, the position of the block copolymer is localized. The phase separation of the blocks forms regular repeating patterns. The patterns are determined by the relative molecular weights of the polymer unit and the block copolymer interaction parameter, X. The copolymer interaction parameter X is the Flory-Huggins interaction parameter, which is related to the energy of the repulsive interaction between the different blocks.

Figure 8:
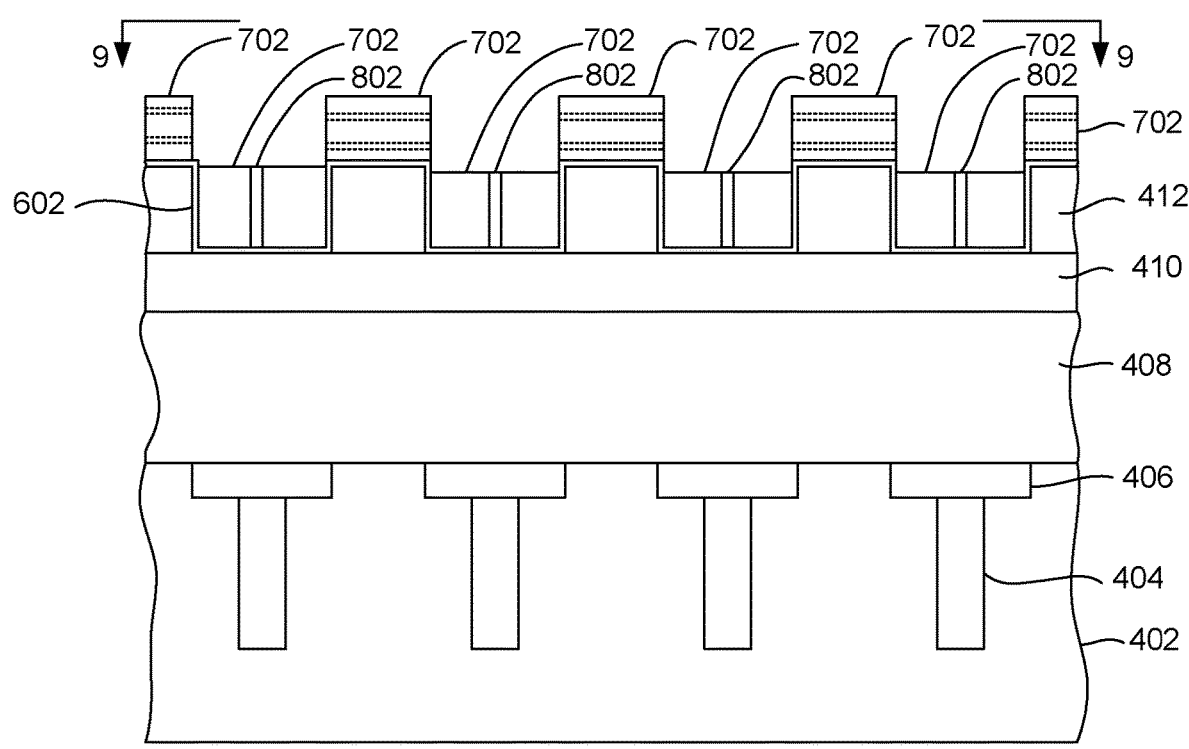
Figure 9:
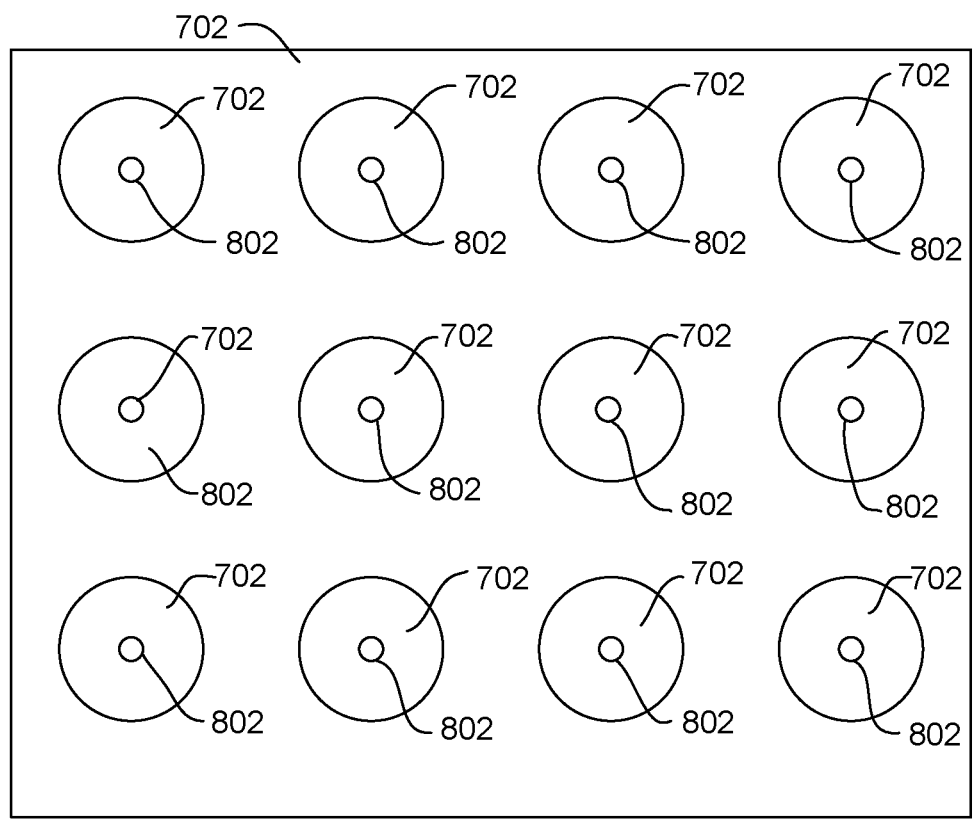

In the present application, as shown in FIG. 8, the annealing causes the block copolymer that is bounded by the mask structure 412 to order with a vertical cylinder surrounded by other block matrix. This annealing can be performed by subjecting the structure to an elevated temperature of about 180 degrees C. to 250 degrees C.

After the annealing has been performed to form the inner cylinders 802 from the block copolymer 702, a process can be performed to infuse the inner cylinders 802 with a metal oxide such as alumina $Al_2O_3$. The metal oxide can be infused into the inner cylinder 802 by a repeating process of exposure to a metal vapor and exposure to an oxidizing environment. The organometallic gas selectively binds with the carbonyl groups in the cylinder block copolymer.

Figure 10:
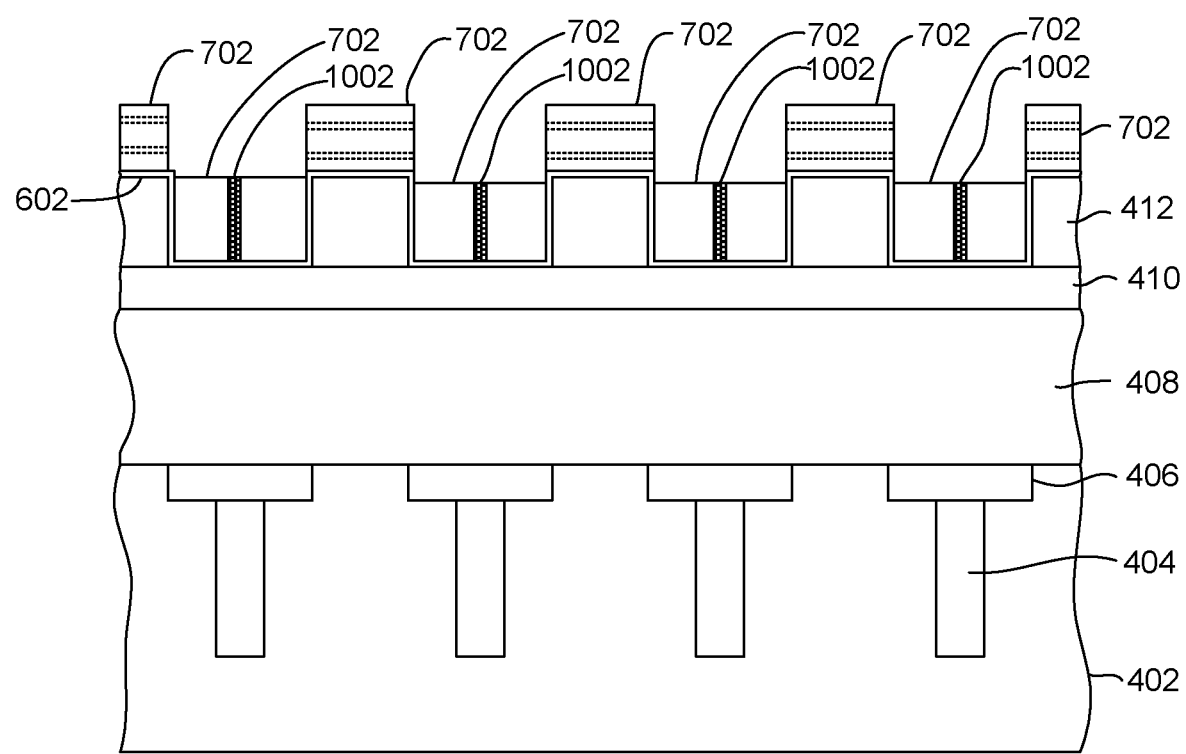

More particularly, the wafer on which the structure is formed is placed in a reaction chamber and annealed in the presence of an organo-metallic gas (or organo-semiconductor gas). Preferably trimethylaluminum (TMA) vapor is used to infuse alumina into the cylindrical pillars 802. After a desired amount of exposure time, the chamber gas is turned off, the reaction vessel is flushed and water vapor ($H_2O$) is introduced into the chamber. The water vapor oxidizes the infused aluminum to form alumina ($Al_2O_3$) in the cylindrical pillars. This process is of exposure to TMA and exposure to water vapor can be repeated a number of times until a desired alumina density and etch resistance is achieved. This process results in alumina pillars 1002 shows as shaded columns in FIG. 10. The resulting alumina pillars 1002 form an excellent mask for future reactive ion etching and ion milling processes, because alumina ($Al_2O_3$) has excellent resistance to removal by reactive ion etching and ion milling.

Figure 11:
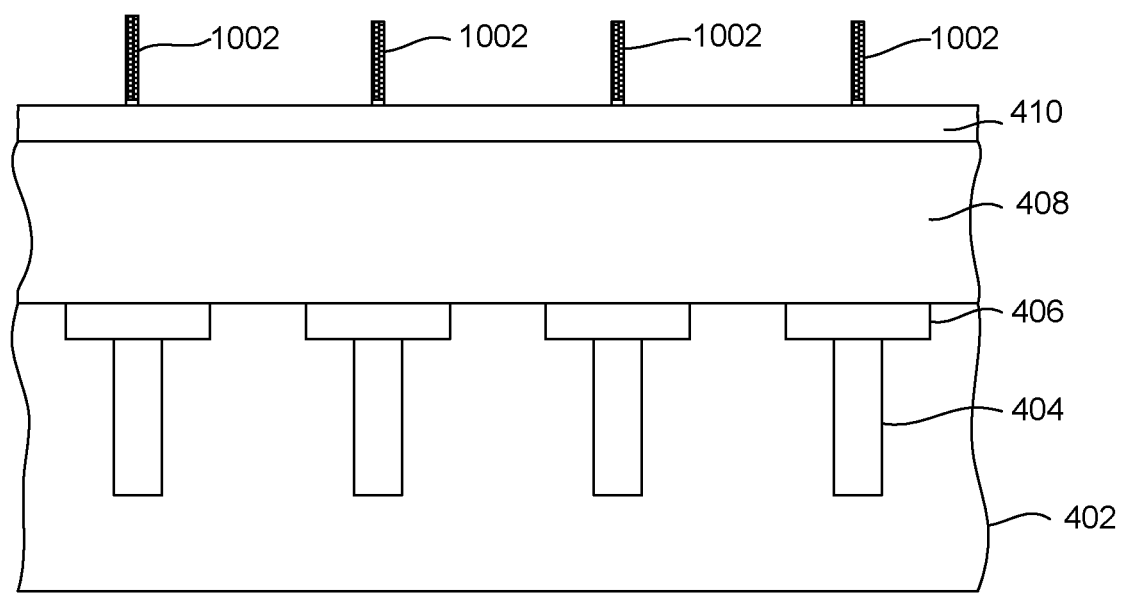

After the above metal oxide infusion has been completed, the remaining block copolymer material (which has not been infused with metal oxide) and remaining mask material 412 can be removed leaving a structure as shown in FIG. 11, with oxide (i.e. alumina) pillars of very small feature size formed over the hard mask 410 and magnetic memory element material 408. The remaining block copolymer material can be removed by an oxygen etch (reactive ion etching in an atmosphere that contains oxygen, such as $O_2$ or $CO_2$, and the remaining mask material 412 can be removed by organic solvents and/or a reactive ion etching in an atmosphere that is chosen to selectively remove the material of the mask 412.

Figure 12:
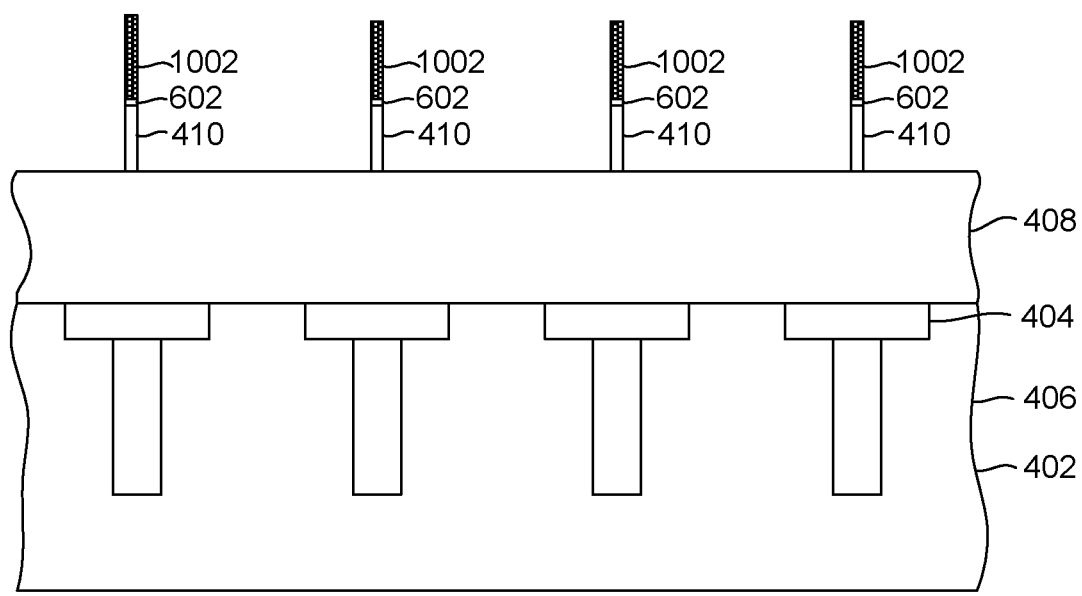

Then, another reactive ion etching is performed to transfer the image of the alumina pillars onto the underlying ion milling hard mask layer 410, leaving a structure as shown in FIG. 12. The reactive ion etching is performed in a chemistry that is chosen to have a high selectivity for removal of the material making up the ion milling hard mask 410. For example, if the ion milling hard mask 410 is formed of carbon, the reactive ion etching can be performed using an oxygen containing atmosphere such as $O_2$ or $CO_2$.

Figure 13:
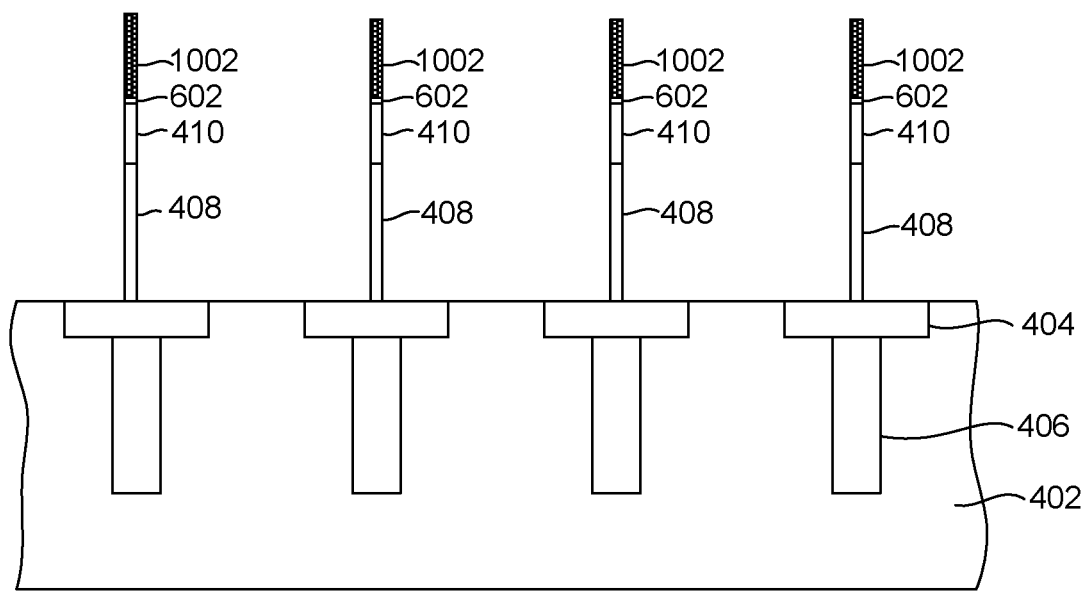

Then, an ion milling process can be performed to remove portions of the magnetic memory material layer 408 that are not protected by the ion milling hard mask 410 and alumina pillars 1002. This leaves a structure such as shown in FIG. 13. It can be seen that the above processes allow for the formation of magnetic memory pillars 408 having a very small feature size, far below the physical limitations of photolithography.

Figure 14:
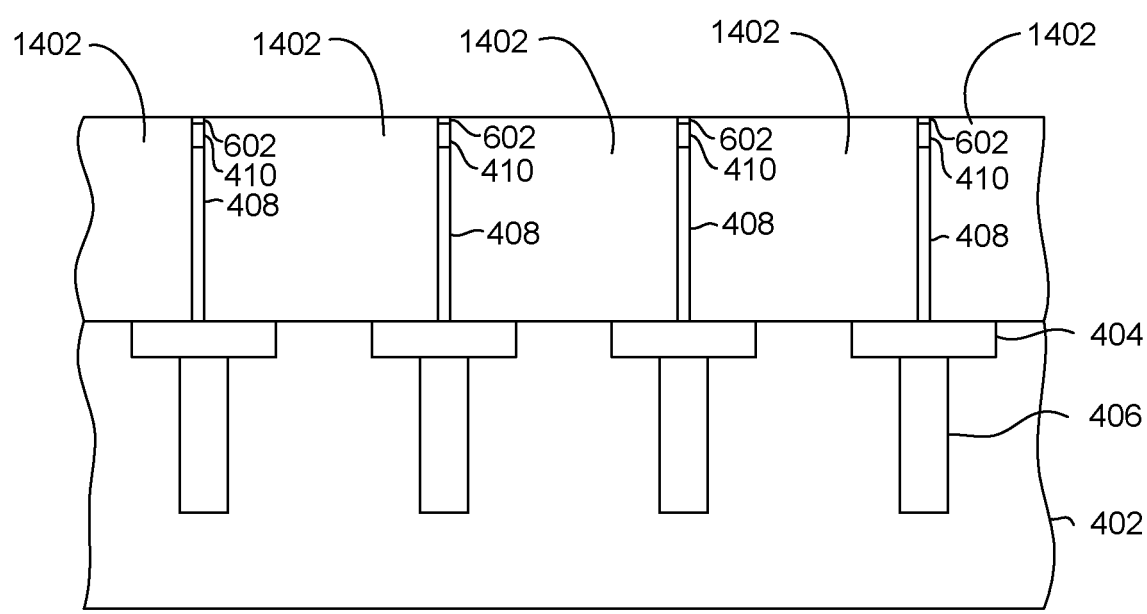
Figure 15:
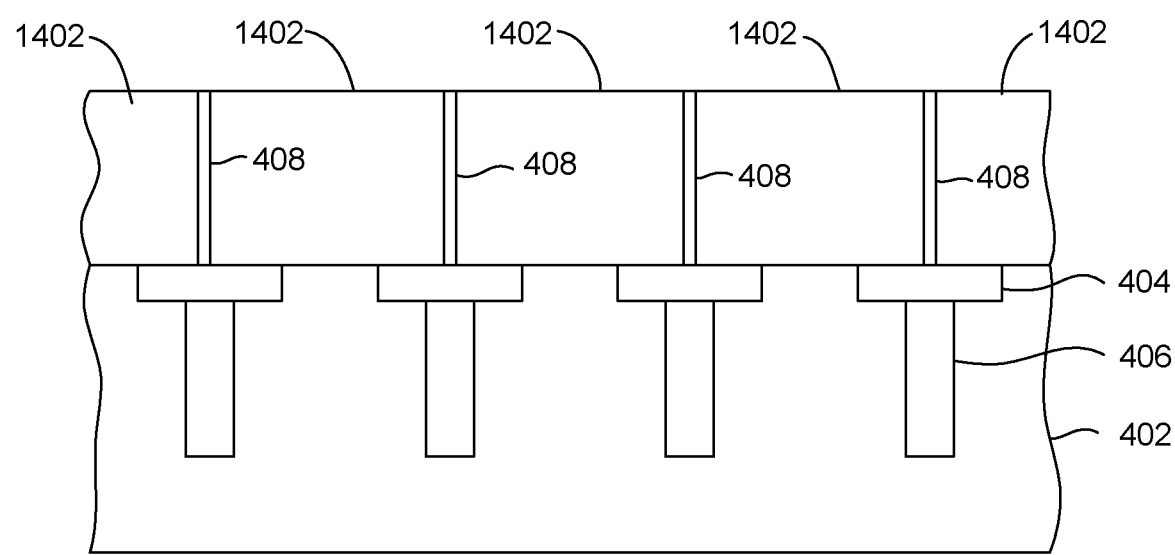

With reference to FIG. 14, one or more layers of electrically insulating material 1402 such as alumina or $SiO_2$ can be deposited. A chemical mechanical polishing (CMP) process can be performed to planarize the surface. The hard mask layer 410 can be used as a CMP stop layer and can be used to protect the underlying magnetic memory pillars 408 from the CMP process. Then, if the hard mask layer (CMP stop layer) 410 is not electrically conductive, a quick reactive ion etching can be performed to remove any remaining hard mask material, exposing tops of the memory element pillars 408. At this point, further manufacturing steps, not shown, can be performed, such as to form upper lead structures.

Figure 16:
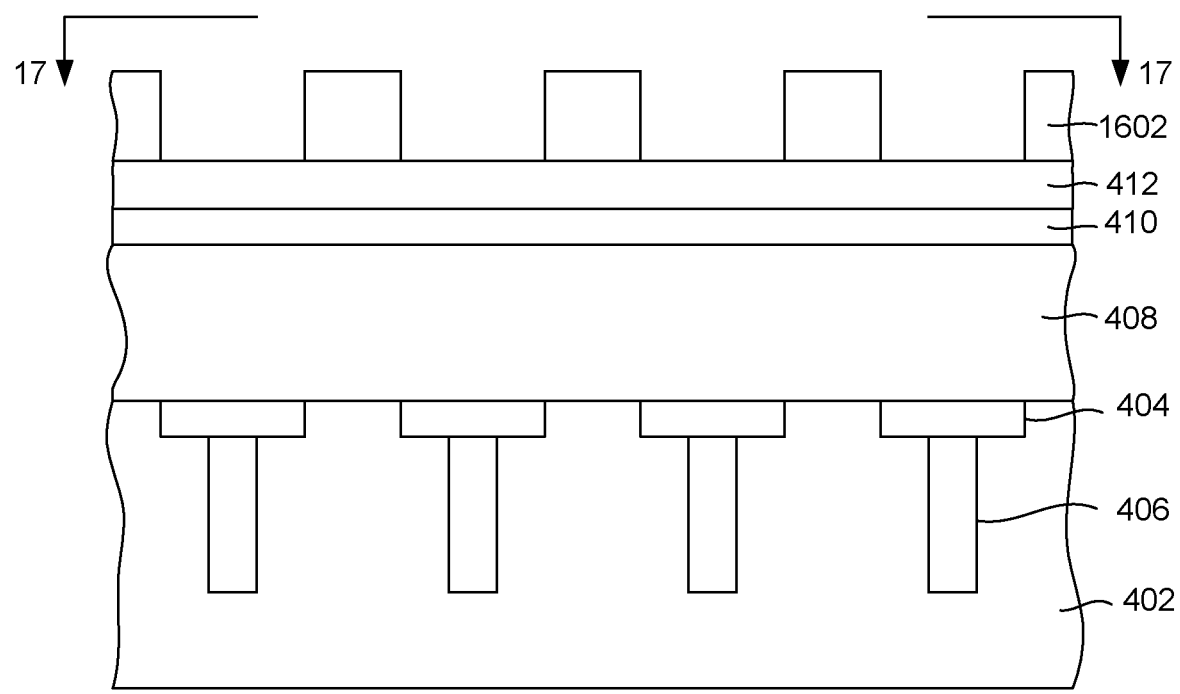
Figure 17:
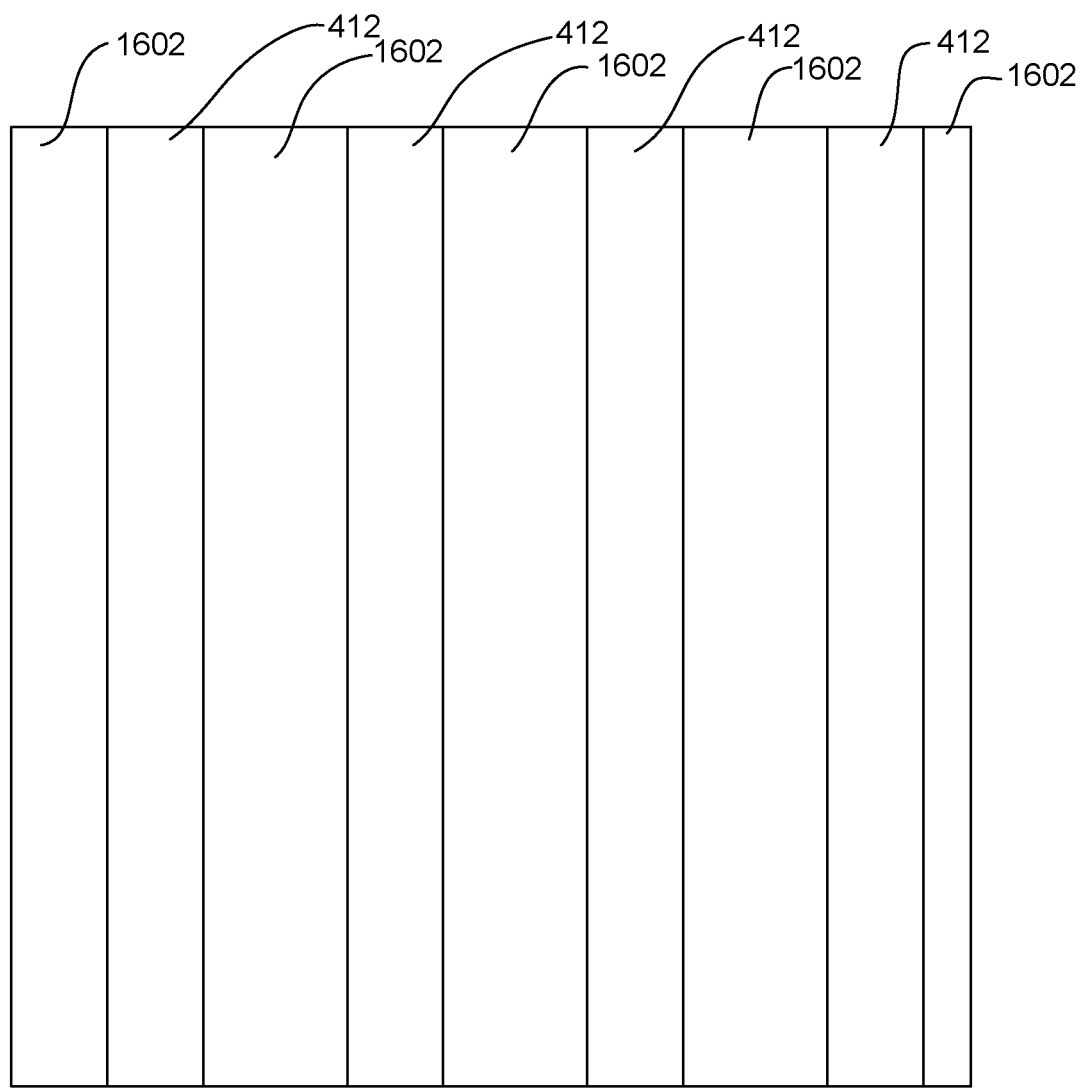
FIGS. 17-20 are views of a wafer in various intermediate stages of manufacture, illustrating an alternate method for manufacturing an array of magnetic random access memory elements.
Figure 20:
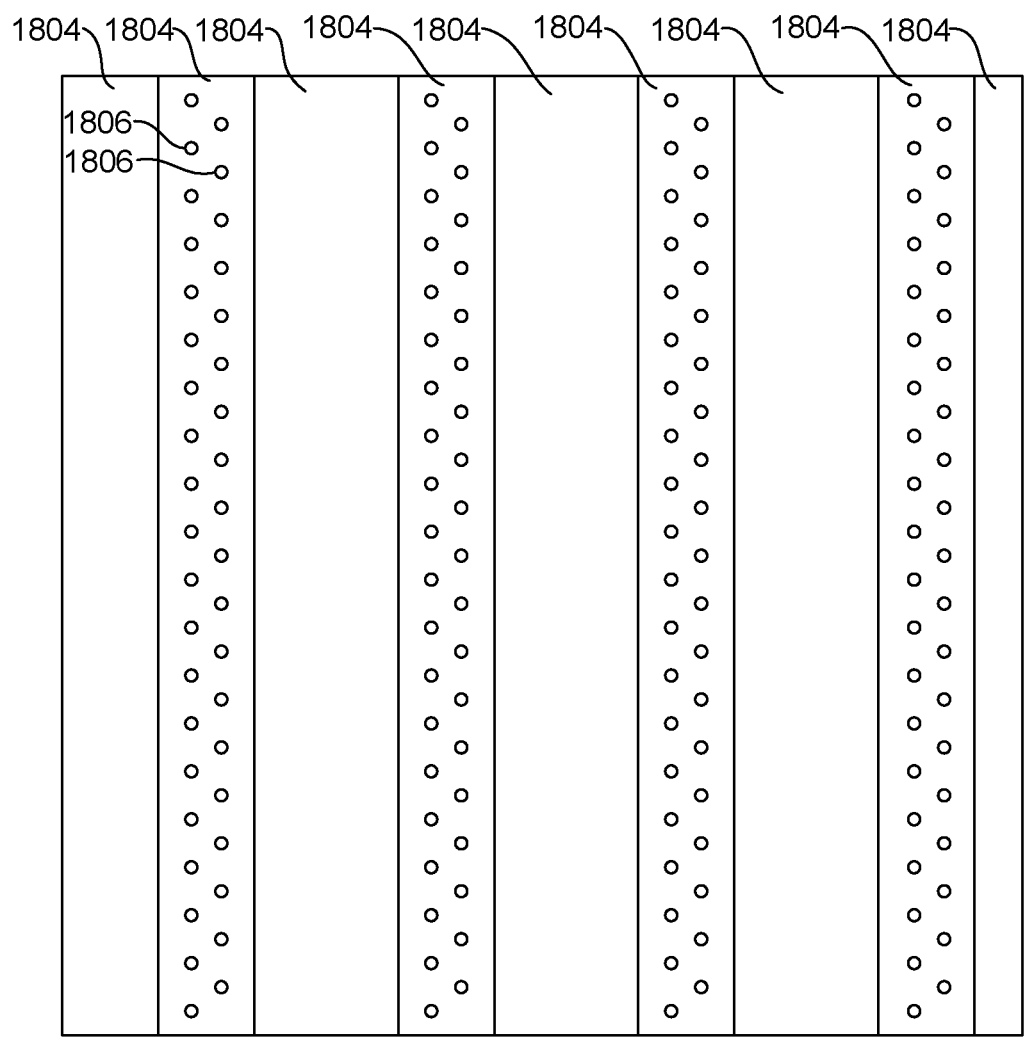

FIGS. 16, through 20 illustrate a similar process for manufacturing magnetic memory array, in which several pillars are formed from one lithographic trench pattern. The pillar spacing is at the natural spacing of the block copolymer, which is below the limits of photolithography. With reference to FIG. 16, a photoresist mask 1602 is formed over first and second mask structures 410, 412. As before, the bottom mask structure 410 is an ion milling hard mask that is capable of withstanding an ion milling process, and can be a material such as diamond like carbon or TaN. The upper mask layer 412 can include more than one layer, such as an image transfer layer such as a hard mask layer that can be patterned by a reactive ion etching process and may also include layers such as an anti-reflective coating (not shown). A photoresist layer 1602 is formed over the second mask layer 412. The mask 1602 is formed by depositing a layer of photoresist material and then photolithographically patterning the photoresist to form openings over regions where magnetic element pillars are to be formed (e.g. over bottom electrical contact layers). However, in this embodiment, the openings in the photoresist mask 1602 are formed as elongated trenches rather than circular openings. This can be seen more clearly with reference to FIG. 17, which shows a top-down view as seen from line 17-17 of FIG. 16.

Figure 18:
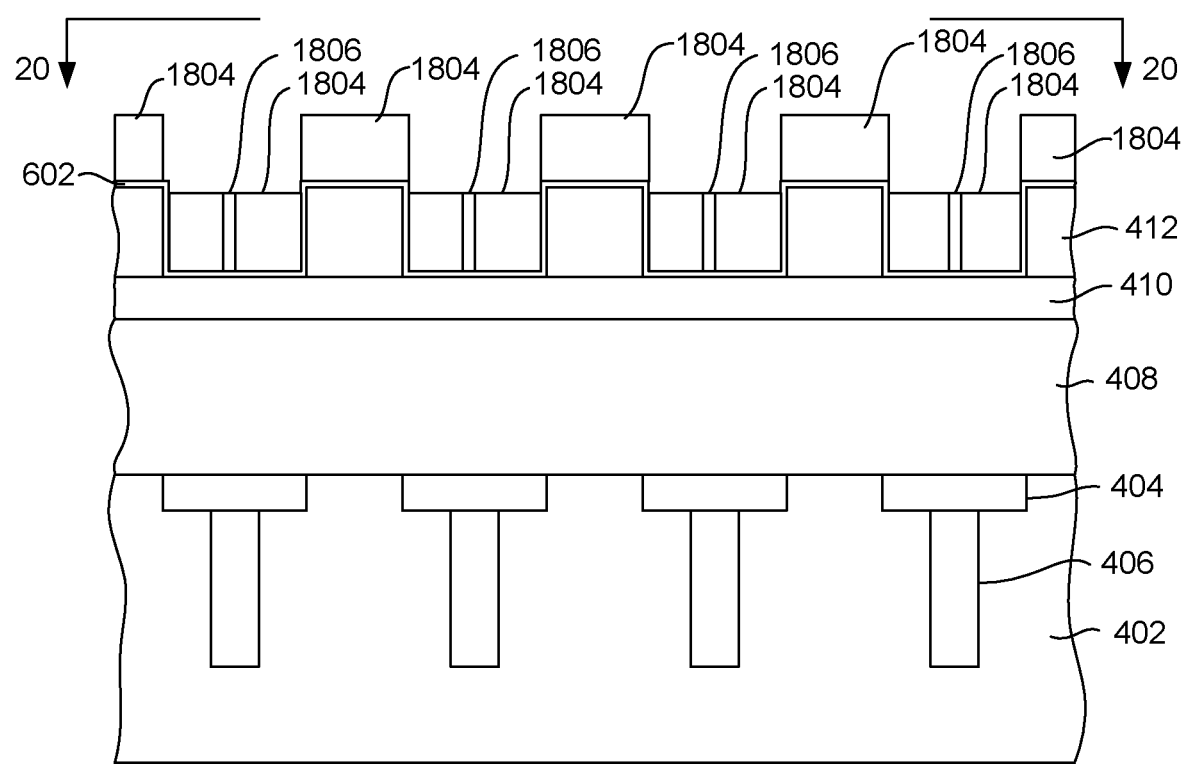
Figure 19:
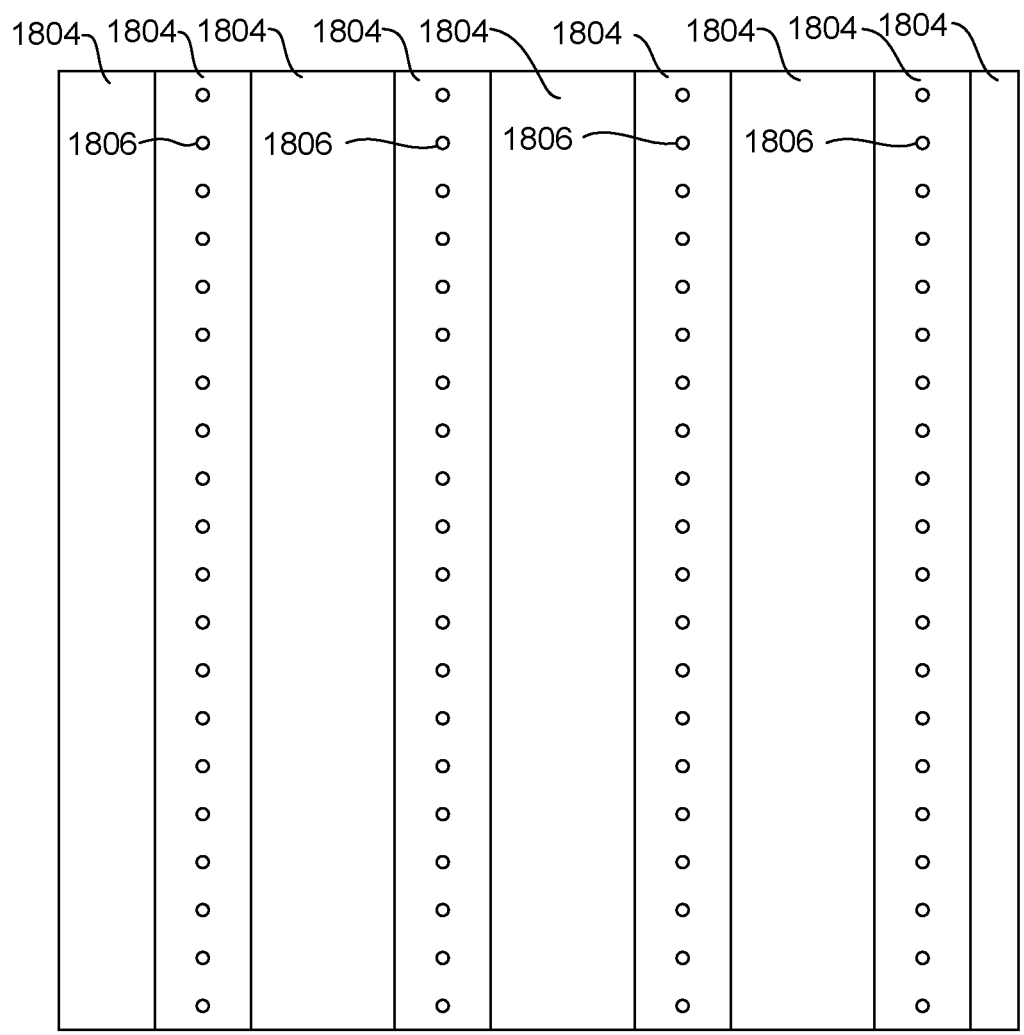

A reactive ion etching can then be performed to transfer the image of the photoresist mask 1602 onto the underlying mask layer. The photoresist mask 1602 can be removed and an optional brush layer 1802 can be deposited (FIG. 18). With reference now to FIG. 18, a block chain copolymer 1804 layer such as xxx is deposited, such as by spin-coating. The block chain copolymer layer 1804 can then be annealed, causing it to segregate, forming cylindrical pillars 1806. As discussed above, block chain copolymers have the property that they segregate into defined shapes when annealed in a confined space. In this case, because the block chain copolymer material 1804 is confined in trenches, rather than the circular patterns of the previously described embodiment, the segregated pillars 1806 will form in a line of pillars along the length of the trench. This can be more easily seen with reference to FIG. 19, which shows a top down view as seen from line 19-19 of FIG. 18.

The number of rows of pillars 1806 that are formed within the trenches of the template can be changed by changing the width of the trenches into which they are formed. The dimension of the trenches must be a multiple of the period of the block copolymer. For example, FIG. 20 shows a set of PMMA pillars formed in a template that has wider trenches. As can be seen, the pillars 1806 are formed as multiple rows. In this case, the pillars 1806 form in an arrangement that resembles a hexagonal close packed (hcp) lattice that fits the dimensions of the trenches formed in the template. From this point, further processes can be performed as previously described to infuse the pillars 806 with metal oxide and to thereafter use the infused pillars as a hard mask to define magnetic element pillars having an extremely small pitch and feature size.

The above described processes can be used to form very magnetic memory element pillars in a much higher density than attainable by the photolithographic pattern. However, these processes can be applied to other applications as well. In addition use in magnetic memory arrays, these processes can be used to form other high density pillar structure for other applications any of a large variety of applications.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A method for manufacturing a magnetic random access memory device, the method comprising:
   providing a substrate;
   depositing a magnetic memory element material over the substrate:
   forming a template over the magnetic memory element material, the template having an opening;
   depositing a block chain copolymer material over the template a portion of the block chain copolymer being deposited into the opening in the template;
   annealing the block chain copolymer to form cylindrical pillars within the openings in the template;
   diffusing a metal into the pillars to form metal oxide pillars; and
   using the metal oxide pillars as a mask to form magnetic memory pillars in the underlying magnetic memory element material;
   wherein the diffusing a metal into the pillars comprises exposing the pillars to trimethylaluminum vapor and exposing the pillars to $H_2O$ vapor; and
   further comprising, before forming the template, depositing a hard mask layer, and wherein process of using the metal oxide pillars as mask to form magnetic memory pillars in the underlying magnetic memory element material further comprises:
   performing a reactive ion etching to transfer the image of metal oxide pillars onto the underlying hard mask; and
   performing an ion milling to transfer the image of the hard mask onto the underlying magnetic memory element material.

2. The method as in claim 1, wherein the exposure to trimethylaluminum vapor and $H_2O$ vapor is repeated for a plurality of cycles.

3. The method as in claim 1, wherein the openings in the template are configured as circular openings.

4. The method as in claim 1, wherein the openings in the template are configured as trenches.

5. The method as in claim 4, wherein the trenches have a width that is configured to cause the block chain copolymer to form a single row of pillars in each opening.

6. The method as in claim 4, wherein the trenches have a width that is configured to cause the block chain copolymer to form multiple rows of pillars in each opening.

7. The method as in claim 6, wherein the pillars arrange in a hexagonal close packed lattice.

8. The method as in claim 4, wherein the trench have a dimension that is a multiple of a period of the block copolymer.

9. The method as in claim 1, wherein forming the template further comprises:
   depositing a hard mask layer;
   depositing a photoresist layer over the hard mask layer;
   patterning the photoresist layer to form a photoresist mask; and
   performing a reactive ion etching to transfer the pattern of the photoresist mask onto the underlying hard mask.

10. The method as in claim 1, wherein the annealing of the block copolymer to form into ordered block copolymer pillars.

11. The method as in claim 1, wherein the diffusing of metal into the pillars further comprises annealing in a reaction chamber in the presence of one or more of an organo-metallic gas or organo-semiconductor gas.

12. The method as in claim 1, further comprising, before depositing a block chain copolymer material, depositing a brush layer.

13. The method as in claim 12, wherein the brush layer is a monomolecular material.

14. The method as in claim 12, wherein the brush layer is a mixture of styrene and methacrylate molecules with a hydroxylated end.

15. The method as in claim 1, wherein the block chain copolymer is poly styrene-b-polymethylmethacrylate.

* * * * *